US011735806B2

(12) United States Patent
Gupta et al.

(10) Patent No.: US 11,735,806 B2
(45) Date of Patent: Aug. 22, 2023

(54) WIRELESS DEVICE WITH WAVEGUIDING STRUCTURES BETWEEN RADIATING STRUCTURES AND WAVEGUIDE FEEDS

(71) Applicant: Texas Instruments Incorporated, Dallas, TX (US)

(72) Inventors: Vikas Gupta, Dallas, TX (US); Meysam Moallem, Plano, TX (US); Sadia Naseem, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 740 days.

(21) Appl. No.: 16/151,441

(22) Filed: Oct. 4, 2018

(65) Prior Publication Data

US 2019/0348746 A1 Nov. 14, 2019

Related U.S. Application Data

(60) Provisional application No. 62/671,213, filed on May 14, 2018, provisional application No. 62/671,184, filed on May 14, 2018.

(51) Int. Cl.
*H01Q 1/22* (2006.01)
*H01Q 1/50* (2006.01)
(Continued)

(52) U.S. Cl.
CPC ..... *H01Q 1/2283* (2013.01); *H01L 23/49838* (2013.01); *H01L 23/66* (2013.01);
(Continued)

(58) Field of Classification Search
CPC ...... H01Q 1/2283; H01Q 1/3233; H01Q 1/50; H01Q 1/52; H01Q 1/521; H01Q 1/523; H01Q 1/525; H01Q 13/02; H01Q 21/0006; H01Q 21/0018; H01Q 21/0025; H01Q 21/0043; H01Q 21/005; H01Q 21/0075; H01Q 21/06; H01Q 21/061; H01Q 21/062;
(Continued)

(56) References Cited

U.S. PATENT DOCUMENTS 9,356,352 B2 * 5/2016 Seok .................. H01Q 9/04
2013/0012145 A1 * 1/2013 Shibuya .............. H01P 5/024
455/90.3
(Continued)

*Primary Examiner* — Robert Karacsony
(74) *Attorney, Agent, or Firm* — Ronald O. Neerings; Frank D. Cimino

(57) ABSTRACT

A high frequency wireless device includes a three-dimensional (3D) antenna structure mounted on a PCB including a first antenna connected to a first waveguide feed and second antenna connected to a second waveguide feed. A packaged device on the PCB has a top metal surface including a transmit (Tx) radiating structure under the second waveguide feed and a receive (Rx) radiating structure under the first waveguide feed, and an RF connection from the top metal surface to its bottom surface. An IC die is flipchip attached to the bottom surface including at least one Rx channel and at least one Tx channel connected by the RF connection to the Rx and Tx radiating structures. Protruding metal features are on the dielectric layer under the first and second waveguide feeds on ≥2 sides of the Tx and the Rx radiating structure to create a waveguiding wall structure for directing signals.

29 Claims, 9 Drawing Sheets

(51) Int. Cl.
 *H01L 23/66* (2006.01)
 *H01Q 21/00* (2006.01)
 *H01L 23/498* (2006.01)
 *H01Q 1/52* (2006.01)
 *H01Q 13/02* (2006.01)
 *H01Q 1/32* (2006.01)

(52) U.S. Cl.
 CPC .............. *H01Q 1/3233* (2013.01); *H01Q 1/50* (2013.01); *H01Q 1/525* (2013.01); *H01Q 13/02* (2013.01); *H01Q 21/0006* (2013.01); *H01L 2223/6627* (2013.01); *H01L 2223/6677* (2013.01)

(58) Field of Classification Search
 CPC .. H01Q 21/064; H01Q 21/065; H01Q 21/067; H01Q 21/0087; H01Q 21/0093; H01L 23/66; H01L 23/49838; H01L 23/49822; H01L 2223/6667; H01L 2223/6627; H01L 2924/15321; G01S 13/931; G01S 7/032; H01P 5/107
 See application file for complete search history.

(56) References Cited

U.S. PATENT DOCUMENTS

2018/0205134 A1 7/2018 Khan et al.
2019/0115643 A1* 4/2019 Khan ................... H01Q 9/0457

* cited by examiner

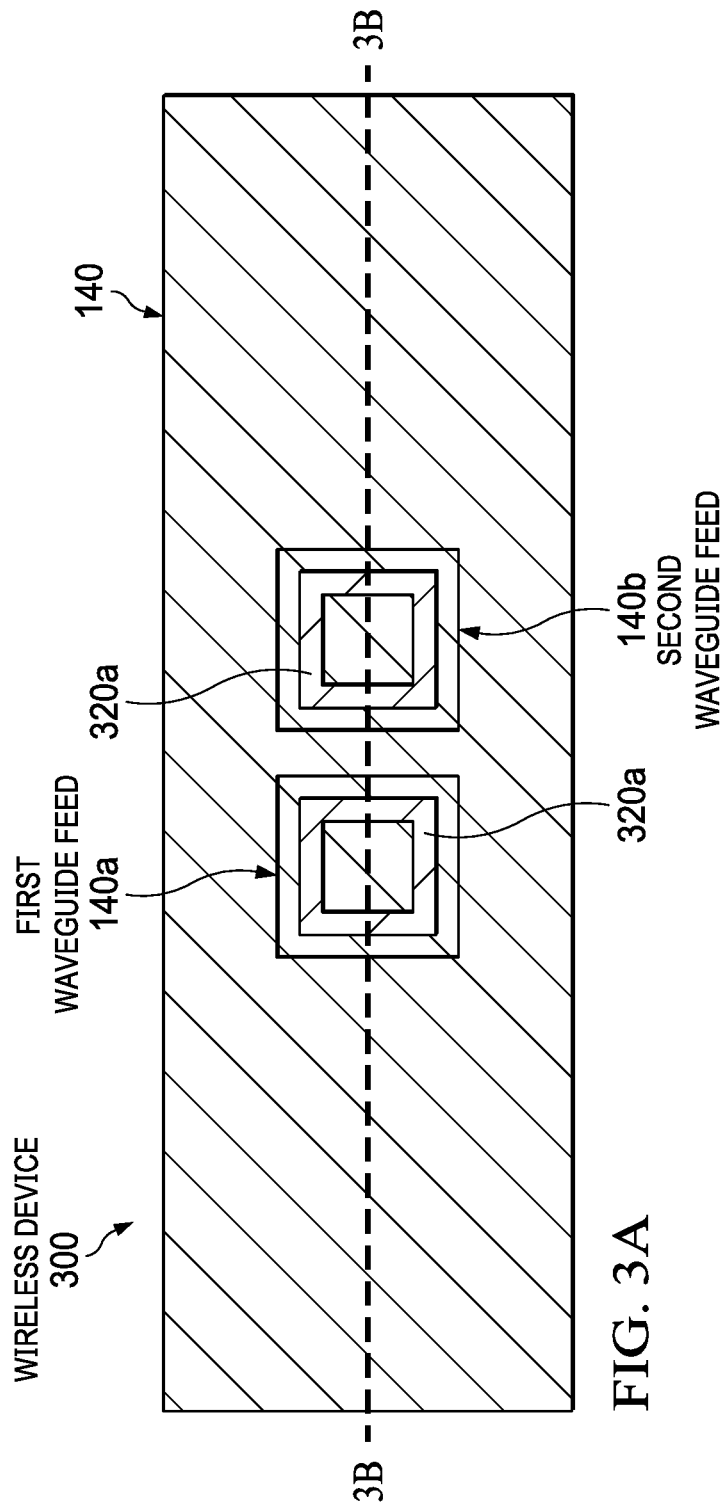

WIRELESS DEVICE WITH WAVEGUIDING STRUCTURES BETWEEN RADIATING STRUCTURES AND WAVEGUIDE FEEDS

CROSS REFERENCE TO RELATED APPLICATIONS

This application claims the benefit of Provisional Application Ser. Nos. 62/671,184 and 62/671,213 filed May 14, 2018 entitled "UTILIZING PACKAGE INTERCONNECT AROUND RADIATING STRUCTURES FOR IMPROVED INTERFACE BETWEEN PACKAGED RADAR CHIP AND EXTERNAL WAVEGUIDE STRUCTURES", and "ATTACHMENT OF VERTICAL LEADFRAME OR ALTERNATE METAL STRUCTURES TO PACKAGE FOR IMPROVED INTERFACE BETWEEN PACKAGED RADAR CHIP AND EXTERNAL WAVEGUIDE STRUCTURES", respectively, which are both herein incorporated by reference in their entireties.

FIELD

This Disclosure relates to high frequency wireless devices comprising a packaged semiconductor device including a package substrate having radiating structures on a top side and an IC die on a bottom side, that is configured for having a three-dimensional (3D) antenna structure having antennas connected to waveguide feeds over the radiating elements for providing air coupled signal paths.

BACKGROUND

The air interface between radiating structures of a packaged wireless device such as a radar device and waveguide feeds of an external 3D antenna is important to radar device functionality. The air gap (the vertical spacing) between the receive (Rx) radiating structure and transmit (Tx) radiating structure in the package and the waveguide feeds should generally be minimized in order to provide greater channel isolation and to lower the insertion loss and reflections. Typically this air gap is designed to be a minimum value that is limited by the package, the antenna, and assembly system manufacturing tolerances.

SUMMARY

This Summary is provided to introduce a brief selection of disclosed concepts in a simplified form that are further described below in the Detailed Description including the drawings provided. This Summary is not intended to limit the claimed subject matter's scope.

Disclosed high frequency wireless devices include a packaged device that comprises protruding metal structures that form a waveguiding wall on at least 2 sides of the Tx and Rx radiating structures of the packaged device for guiding wireless signals communicated between the radiating structures and the waveguide feeds (openings in the 3D antenna structure) that are connected to respective antennas. Disclosed waveguiding walls reduce the sensitivity to vertical tolerances between the Tx and Rx radiating structures and the waveguide feeds. For relatively large vertical air gaps (generally larger than 0.1 mm) between the Tx and Rx radiating structures package and their waveguide feeds, disclosed waveguiding walls on at least 2 sides the Tx and Rx radiating structures significantly improve the insertion loss and isolation between adjacent channels in the case of a multi-channel wireless device.

The packaged device is configured for being mounted on a printed circuit board (PCB) that also has a 3D antenna structure mounted thereon. A top side of the package substrate includes a Tx radiating structure under what is termed herein a second waveguide feed and a Rx radiating structure under what is termed herein a first waveguide feed, where the radiating structures are covered by a dielectric layer that the protruding metal structures are on. There is a radio frequency (RF) signal path between the radiating elements on the top metal surface to the bottom surface of the package substrate. An integrated circuit (IC) die is flipchip attached to the bottom surface of the package substrate including at least one Rx channel including Rx circuitry and at least one Tx channel including Tx circuitry for connecting the RF connection to the Tx and Rx radiating structures. The protruding metal features create a waveguiding wall for directing signals from the Tx radiating structure through the second waveguide feed to the second antenna and from the first antenna through the first waveguide feed to the Rx radiating structure.

BRIEF DESCRIPTION OF THE DRAWINGS

Reference will now be made to the accompanying drawings, which are not necessarily drawn to scale, wherein:

FIG. 3A shows a top view and FIG. 3B shows a side view of an example high frequency wireless device comprising a packaged device with disclosed walls of protruding metal features in an interface between the radiating structures and the waveguide feeds, wherein the protruding metal features comprise a leadframe (LF) bonded to a dielectric layer on the surface of a package substrate, according to an example aspect.

DETAILED DESCRIPTION

Figure 1A:
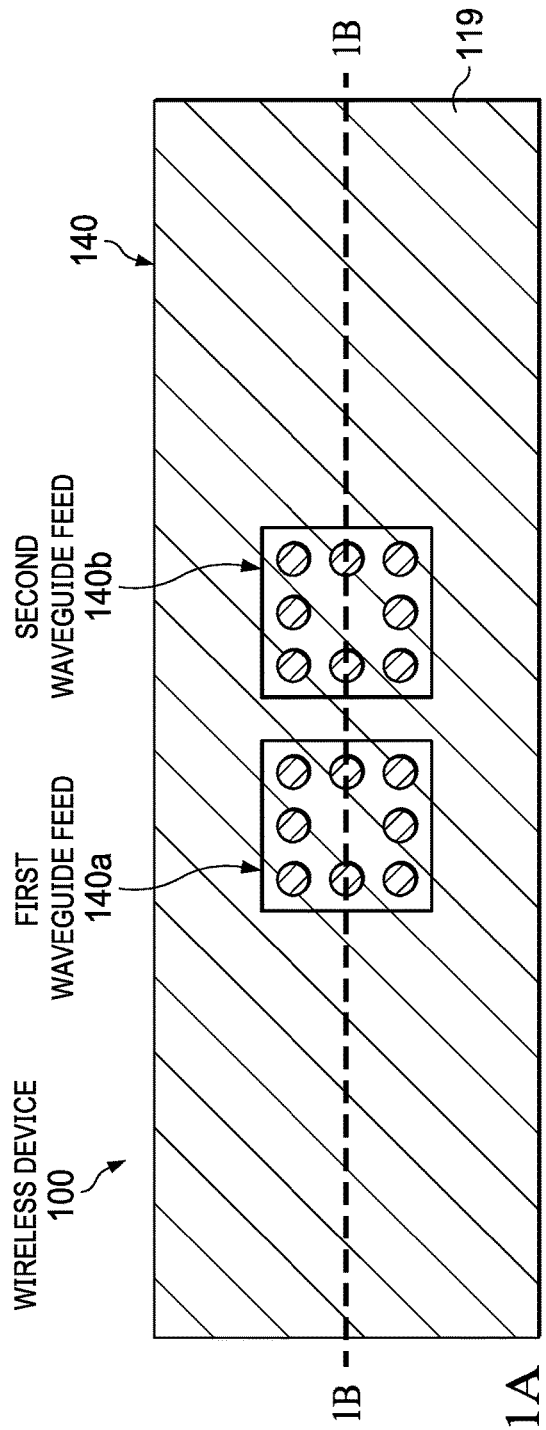
FIG. 1A shows a top view and FIG. 1B a side view of an example high frequency wireless device including a packaged device having protruding metal features in an interface between the radiator structures and the waveguide feeds, wherein the protruding metal features comprise a plurality of separate metal features arranged in lines, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1C:
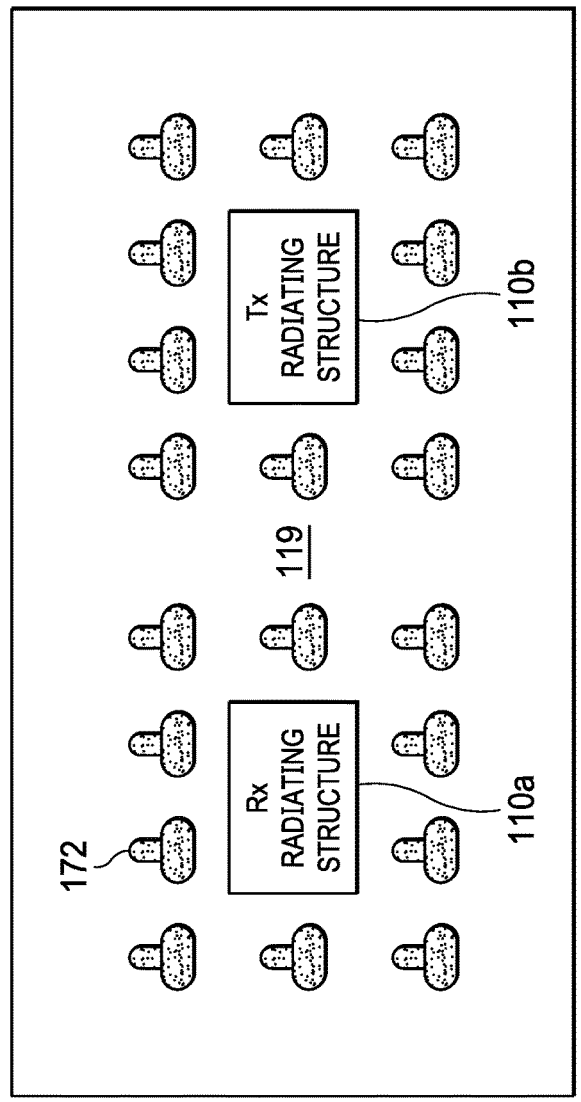
FIG. 1C is a top-down view of Rx and Tx radiating structures having walls of protruding metal features comprising stud bumps.
Figure 1B:
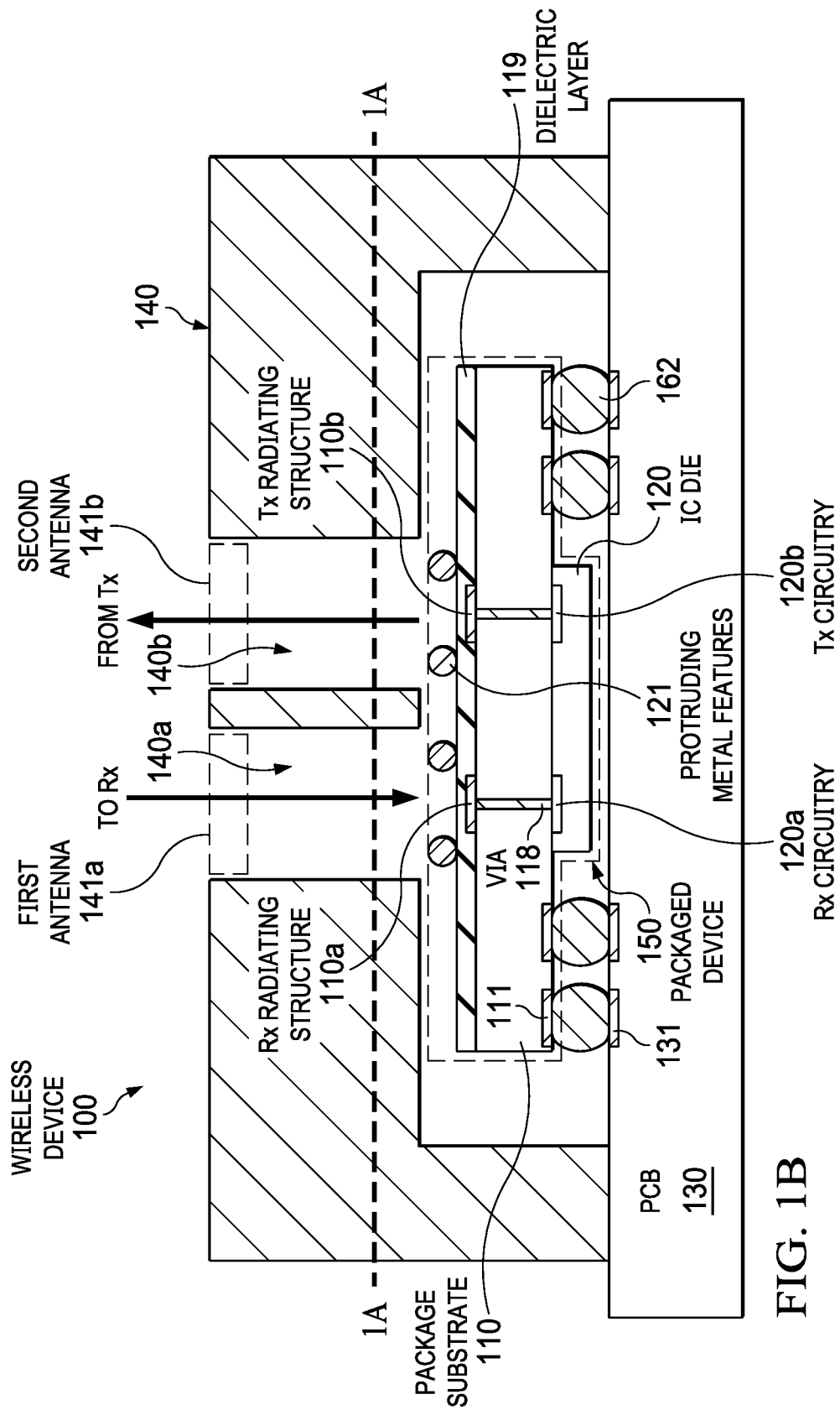
FIG. 1D is a top-down view of the Rx and Tx radiating structures having walls of protruding metal features comprising solder bumps.
FIG. 1E is a top-down view of the Rx and Tx radiating structures having walls of protruding metal features comprising wire loops.

FIG. 1A shows a top view and FIG. 1B a side view along section lines 1B-1B in FIG. 1A of an example high frequency wireless device 100 including a packaged device 150 comprising a package substrate 110 attached by contact pads 111 on its bottom side by solder balls 162 shown to contact pads 131 on the top surface of a PCB 130. Although the high frequency wireless device 100 is generally described herein as being a radar device, this Disclosure is not limited to radar devices because any high frequency wireless device where an RF signal is coupled to an external antenna can benefit from this Disclosure, such as a WiFi transceiver, for example operating at a frequency from 40 GHz to 80 GHz. The package substrate 110 can comprise a variety of substrate types, such as an organic substrate, a flexible plastic substrate, or a paper-based substrate.

Figure 4A:
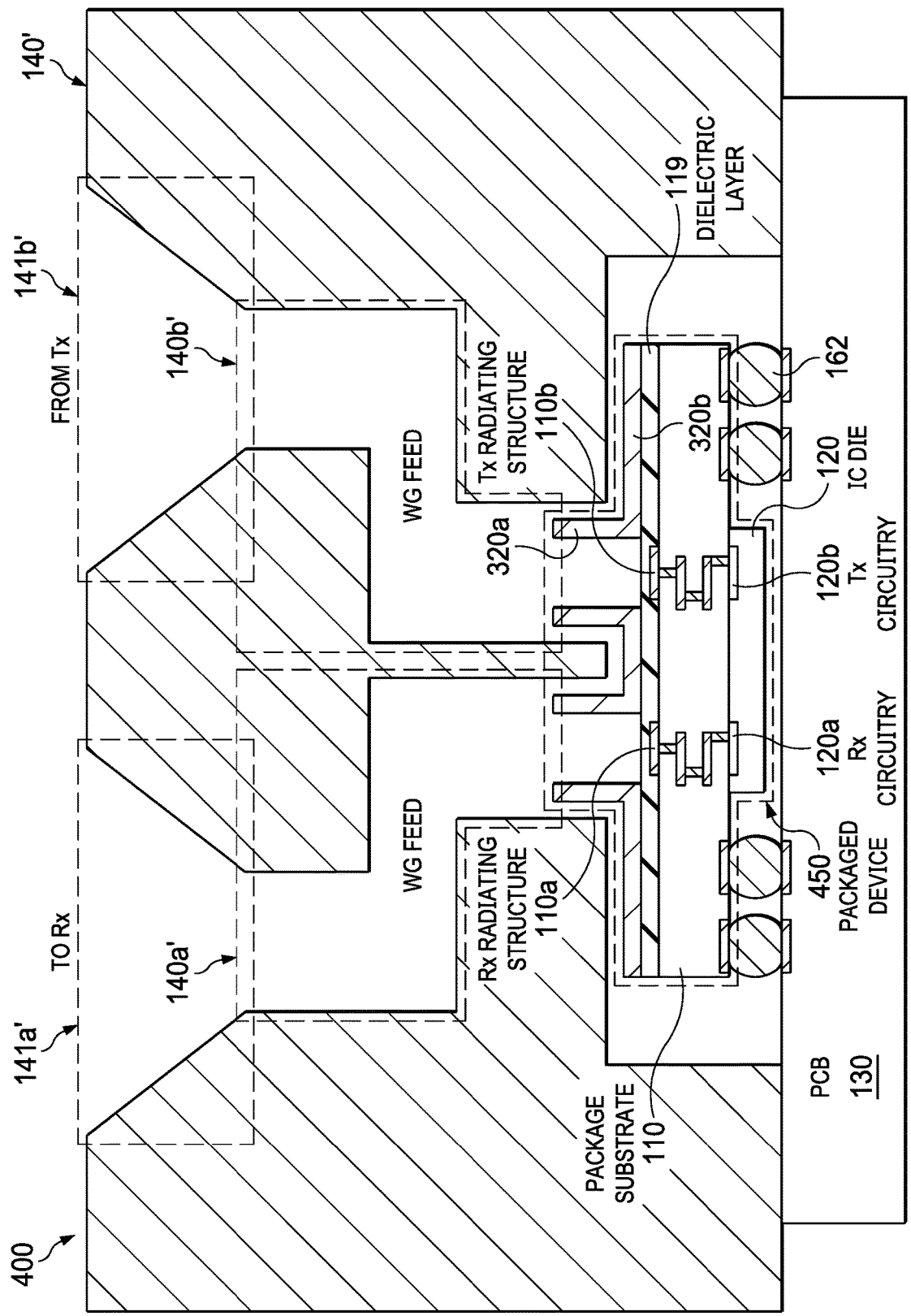
FIG. 4A shows a side view and FIG. 4B a cross sectional view of an example high frequency wireless device comprising a packaged device with disclosed walls of protruding metal features in an interface between the radiating structures and the waveguide feeds, wherein the protruding metal features as in FIGS. 3A and 3B comprise a LF bonded to a dielectric layer on the surface of a package substrate, according to an example aspect. The antennas are shown as horn antennas, and the RF connections including capacitive coupling in the signal paths.

The PCB 130 (see FIG. 1B) has traces (not shown) for carrying DC power and data transfer, the contact pads 131, and can also have circuitry thereon (not shown), such as a processor. On the top surface of the PCB 130 is a 3D antenna structure 140 shown in FIG. 1B including a first waveguide feed 140a connected to a first antenna 141a and a second waveguide feed 140b connected to a second antenna 141b, where the antennas can comprise for example a horn antenna or a waveguide slot array antenna. FIG. 4A described below shows the antennas as antennas 141a' and 141b' that each depict horn antennas. The waveguide feeds 140a, 140b are openings in the 3D antenna structure 140 that guide signals to and from the packaged device 150.

Figure 3B:
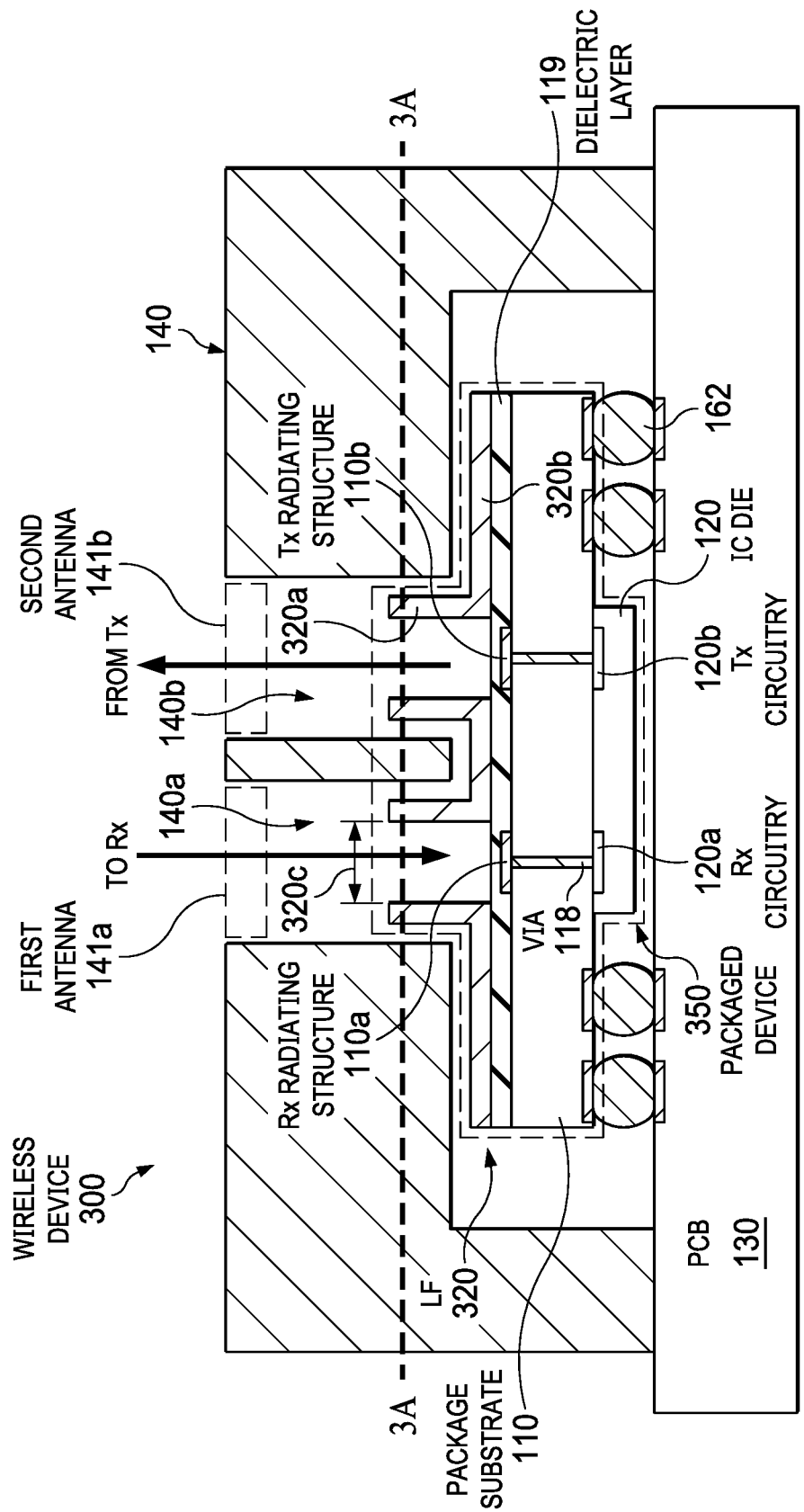

The 3D antenna structure 140 comprises a hollow metal walled structure, such as having a rectangular or circular, cross section. In operation, the wireless device 100 transmits signals and receives signals through air coupling between the waveguide feeds 140a, 140b and their associated Rx and Tx radiating structures 110a, 110b. The packaged device 150 on its top side includes protruding metal features 121 on a dielectric layer 119 (e.g., solder mask material) configured as a disclosed waveguiding wall in an interface between the Rx radiating structure 110a and the first waveguide feed 140a and the Tx radiating structure 110b and the second waveguide feed 140b. Although the protruding metal features 121 are shown having a height less than a height of the air gap between the dielectric layer 119 and the waveguide feeds 140a, 140b, the protruding metal features can be tall enough to extend into a bottom of the waveguide feeds 140a, 140b, such as shown in FIGS. 3A and 3B described below.

The package substrate 110 includes a radio frequency (RF) connection that generally comprises at least one via 118 as shown in FIG. 1B, such as a stacked via arrangement, that extends from the top metal surface to the bottom surface of the package substrate 110. The RF connection can also include an RF-coupled non-physical signal path or path portion, such as a capacitively coupled portion, for example a slot-fed antenna (see FIG. 4B described below). There is a high frequency IC die 120 flipchip attached to the bottom surface of the package substrate 110 that includes at least one channel including at least one Rx channel including Rx circuitry 120a and at least one Tx channel including Tx circuitry 120b, with the Rx and Tx channels connected by respective RF connections to the Tx radiating structure 110b and to the Rx radiating structure 110a.

The protruding metal features 121 are on at least 2 sides of the Tx radiating structure 110b and on at least 2 sides the Rx radiating structure 110a configured to create a waveguiding wall structure for directing signals in an air gap from the Tx radiating structure 110b through the second waveguide feed 140b to the second antenna 141b, and from the first antenna 141a through the first waveguide feed 140a to the Rx radiating structure 110a. The protruding metal features 121 can comprise metal stud bumps (see FIG. 1C), solder balls (see FIG. 1D), or wirebond loops (see FIG. 1E), that can be separate features or can be overlapping features. Although for simplicity a single through-via 118 is shown in FIG. 1B from the Rx circuitry 120a and TX circuitry 120b on the IC die 120 to the Rx radiating structure 110a and Tx radiating structure 110b, because the package substrate 110 is generally a multi-layer structure, there can be series of micro-vias and plated thru-vias that form these connections.

Figure 1D:
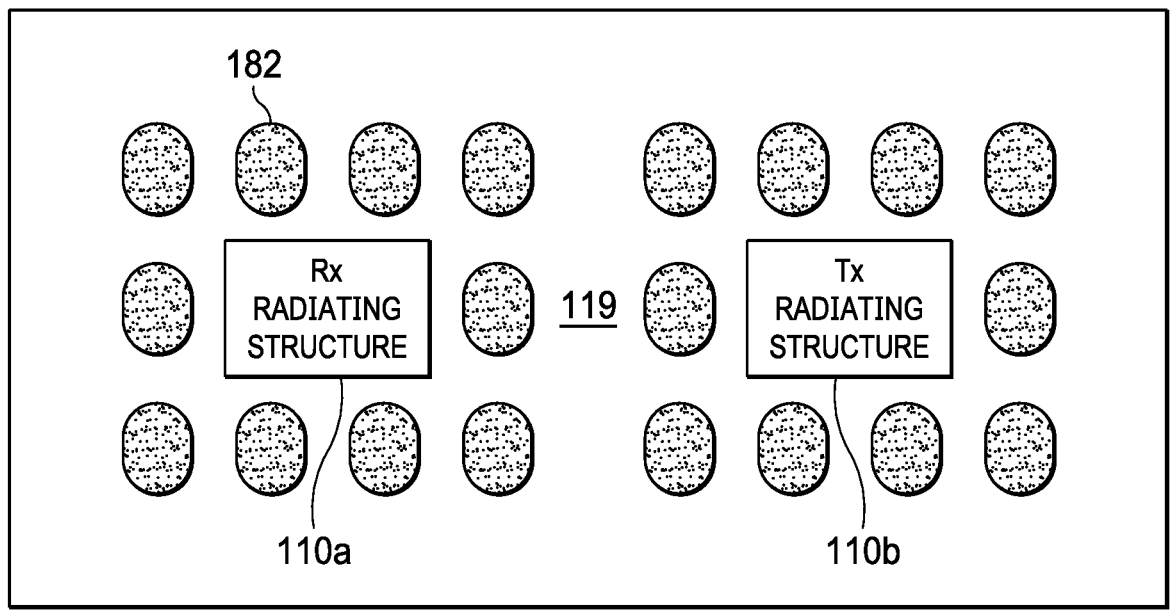
Figure 1E:
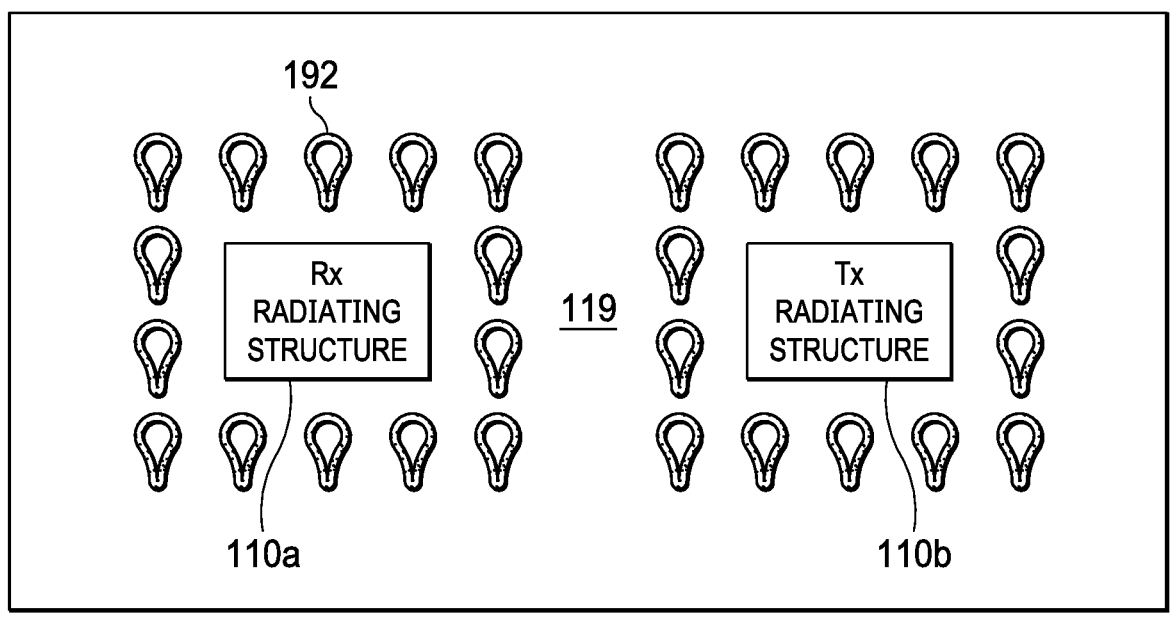

FIG. 1C is a top-down view of the Rx and Tx radiating structures 110a, 110b having walls of protruding metal features comprising stud bumps 172. FIG. 1D is a top-down view of the Rx and Tx radiating structures 110a, 110b having walls of protruding metal features comprising solder bumps, copper pillars of solder ball grid arrays (BGAs) 182, and FIG. 1E is a top-down view of the Rx and Tx radiating structures 110a, 110b having walls of protruding metal features comprising the radiating structures having surrounding walls of wire loops 192.

In addition, disclosed walls for the packaged device can be created by selective additive deposition of a metal comprising material to form the protruding metal features 121 through a printing process to achieve improved insertion loss and isolation between adjacent channels. For example, copper about 150 to 250 microns thick can be formed using photonic printing. In this process, a metal precursor that comprises an ink is printed that comprises a material that is a solid or a precursor for a solid that forms a solid upon the laser processing that results in having a porosity of greater than 5%, typically greater than 10%.

Figure 2A:
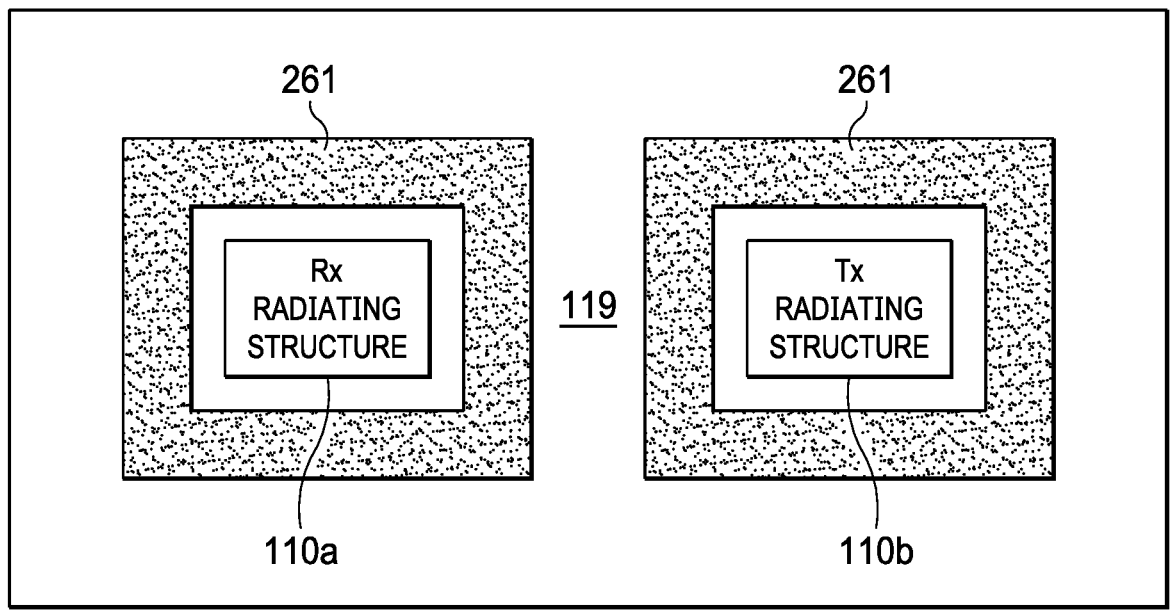
FIG. 2A is a top-down view of example radiating structures having surrounding walls of metal structures formed by additive printing.
Figure 2B:
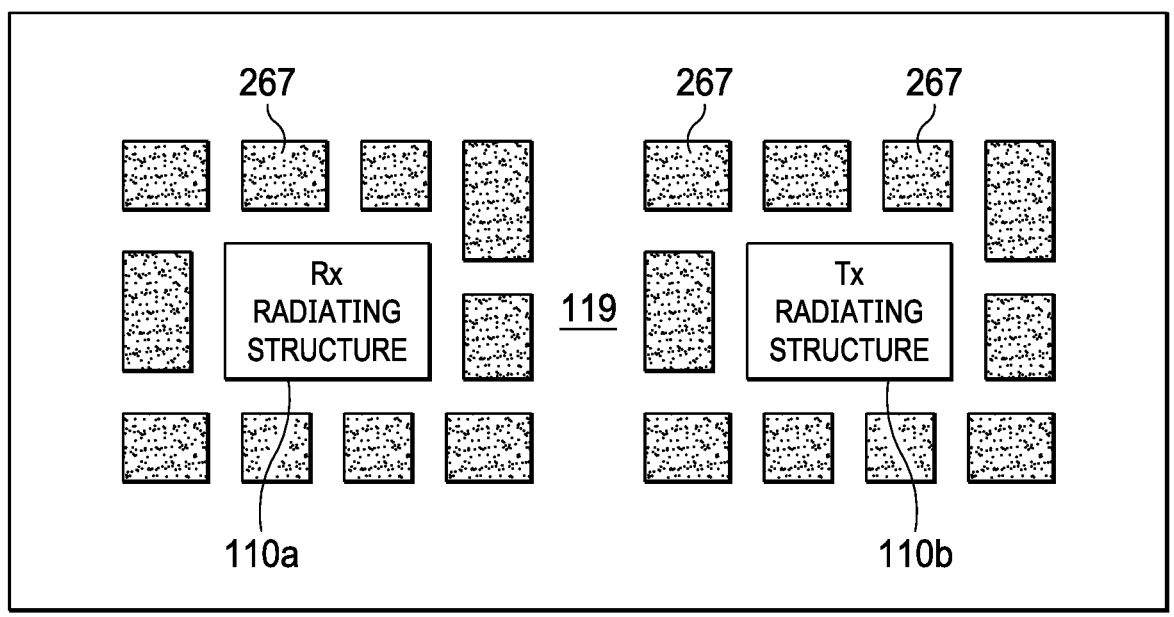
FIG. 2B is a top-down view of another example radiating structures having surrounding walls of spaced apart metal structures formed by additive printing.

FIG. 2A is a top-down view of example waveguiding structures having surrounding walls of metal structures 261 formed by additive printing which can comprise photonic printing with laser light, instead of the previously described protruding metal bumps in FIG. 1B. FIG. 2B is a top-down view of another example waveguiding structure having spaced apart metal features 267 providing surrounding walls again formed by additive printing instead of the previously described protruding metal bumps in FIG. 1B. The additive printing can generally be any additive manufactured metal process that forms printed features.

FIG. 3A shows a top view and FIG. 3B shows a side view of example high frequency wireless packaged device 300 having a packaged device including disclosed protruding metal shown as 320a being full thickness regions of a LF in an interface region between Rx and Tx radiating structures 110a, 110b (shown in FIG. 3B) and the first and second waveguide feeds 140a, 140b. The packaged device in FIG. 3B is shown as 350, where the packaged device 350 for its protruding metal has a LF 320 bonded (e.g. by an epoxy material) to the dielectric layer 119 on the top surface of the package substrate 110. As shown in FIG. 3B the LF 320 has full thickness regions 320a providing vertical walls, half-etched regions 320*b*, and LF aperture regions 320*c*. The vertical walls framing the LF apertures regions 320*c* are within a volume defined by the first waveguide feed 140*a* and the second waveguide feed 140*b*.

Figure 4B:
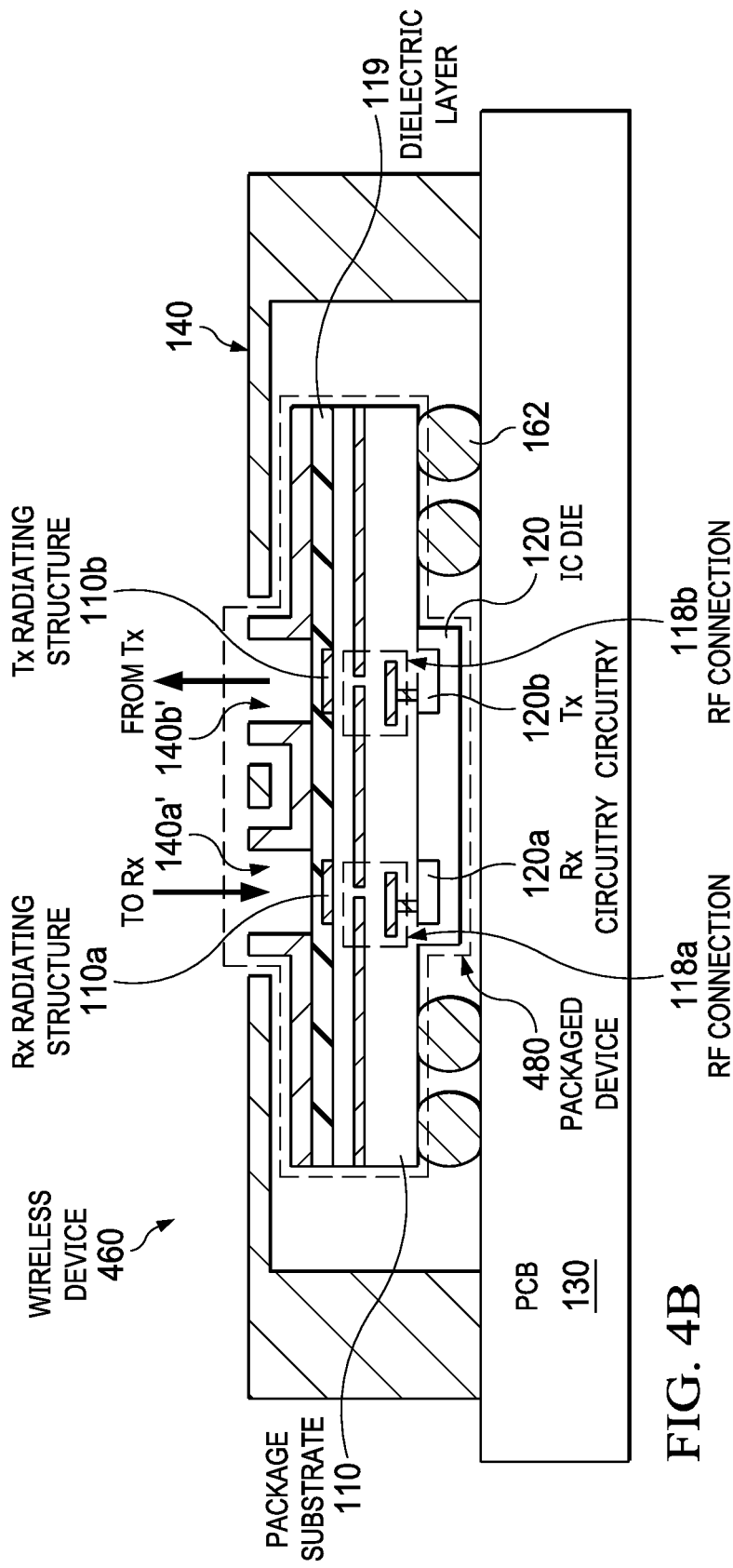

FIG. 4A shows a side view of an example high frequency wireless device 400 having a packaged device 450 and FIG. 4B a cross sectional view of example high frequency wireless device shown as wireless device 460 including packaged device 480 that have different reference numbers due to a different RF connection shown through the package substrate 110. The respective packaged devices 450, 480 each have disclosed walls of protruding metal features in an interface between the radiating structures 110*a* and 110*b* and their waveguide feeds 140*a*' and 140*b*' that as in FIGS. 3A and 3B comprise a LF bonded to a dielectric layer 119 on the surface of a package substrate 110 having full thickness regions 320*a*, half-etched regions 320*b*, and LF aperture regions 320*c*, including vertical walls in the full thickness regions framing the LF apertures that are within a volume defined by the first and the second waveguide feeds to the dielectric layer 119. The antennas 141*a*' and 141*b*' are shown in FIG. 4A as horn antennas. The RF connections 118*a* and 118*b* shown between the top metal surface and the bottom surface of the packaged substrate 110 in FIG. 4B include capacitive coupling in the signal path shown as slot-fed patch antennas.

Disclosed aspects can be integrated into a variety of assembly flows to form a variety of different semiconductor IC devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Figure 5:
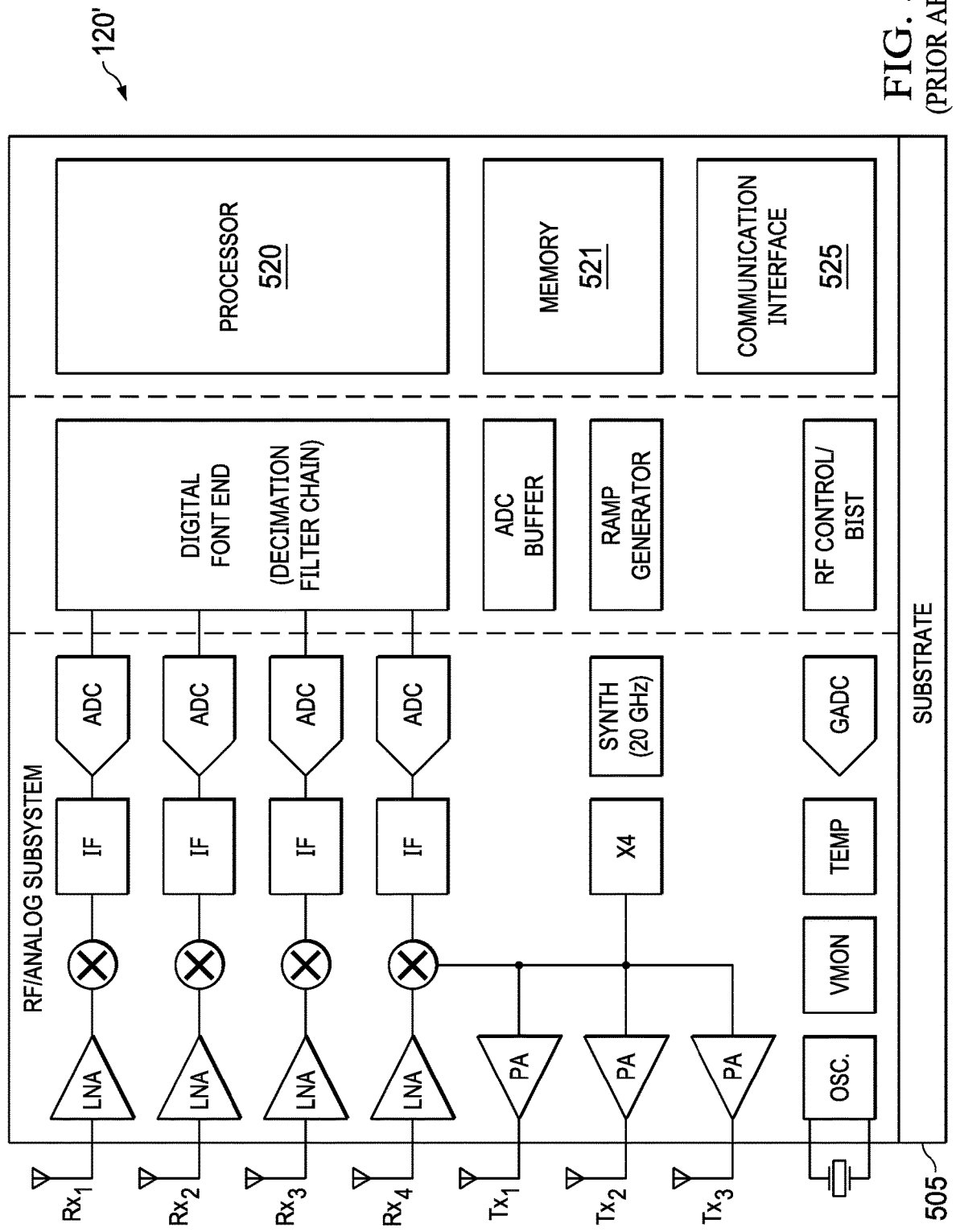
FIG. 5 shows a specific implementation of a high frequency IC die shown as a radar chip comprising a semiconductor substrate including a plurality of channels including 4 Rx channels and 3 Tx channels formed thereon, with their associated antennas also shown.

FIG. 5 shows a specific implementation of a high frequency IC die shown by example as a single radar chip 120' comprising a semiconductor substrate 505, such as comprising silicon, including a plurality of channels including 4 Rx channels ($Rx_1$ to $Rx_4$) and 3 Tx channels ($Tx_1$ to $Tx_3$) formed thereon, with their associated antennas also shown by an antenna symbol. For this single radar chip 120' device, although not shown, there will be 7 radiating structures on the package substrate and 7 corresponding waveguide feeds each having a dedicated antenna. The radar chip 120' includes at least one processor 520 having an associated memory 521 and a communication interface 525.

The radar chip 120' in one specific example can be the Texas Instruments Incorporated IWR1443 which is an integrated single-chip mmWave sensor based on Frequency-Modulated Continuous-Wave (FMCW) radar technology capable of operation in the 76-GHz to 81-GHz band with up to a 4 GHz continuous chirp. The IWR1443 includes a built-in phase locked loop (PLL) and analog-to-digital converters (ADCs). The IWR1443 device includes fully configurable hardware accelerator that supports complex fast Fourier transform (FFT) and constant false alarm rate (CFAR) detection.

Those skilled in the art to which this Disclosure relates will appreciate that many other aspects and variations thereof are possible within the scope of the claimed invention, and further additions, deletions, substitutions and modifications may be made without departing from the scope of this Disclosure.

The invention claimed is:

1. A high frequency wireless device, comprising:
a printed circuit board (PCB);
a three-dimensional (3D) antenna structure mounted on a top surface of the PCB including a first antenna connected to a first waveguide feed and a second antenna connected to a second waveguide feed;
a packaged device comprising a package substrate attached to the top surface of the PCB having a top metal surface including a transmit (Tx) radiating structure under the second waveguide feed and a receive (Rx) radiating structure under the first waveguide feed, with a radio frequency (RF) connection from the top metal surface to a bottom surface, with an integrated circuit (IC) die flipchip attached to the bottom surface that includes at least one Rx channel including Rx circuitry and at least one Tx channel comprising Tx circuitry, and with the Rx and Tx channels connected by respective ones of the RF connection to the Tx radiating structures and to the Rx radiating structures;
a dielectric layer on the top metal surface;
at least one row of protruding metal features on the dielectric layer positioned under the first and second waveguide feeds on at least 2 sides of the Tx radiating structure and the Rx radiating structure configured to create a waveguiding wall structure for directing signals from the Tx radiating structure through the second waveguide feed to the second antenna from the first antenna through the first waveguide feed to the Rx radiating structure.

2. The high frequency wireless device of claim 1, wherein the at least 2 sides includes all 4 sides around both the Tx radiating structure and the Rx radiating structure.

3. The high frequency wireless device of claim 1, wherein the protruding metal features comprise a plurality of separate metal features that comprise solder balls, metal studs, or wirebond loops.

4. The high frequency wireless device of claim 1, wherein the protruding metal features overlap.

5. The high frequency wireless device of claim 1, wherein the protruding metal features comprise a leadframe (LF) bonded to the dielectric layer having full thickness regions, half-etched regions, and LF aperture regions, including vertical walls in the full thickness regions framing the LF aperture regions that are within a volume defined by the first and the second waveguide feeds.

6. The high frequency wireless device of claim 1, wherein the high frequency wireless device comprises a radar device.

7. The high frequency wireless device of claim 6, wherein the radar device consists of a single chip comprising a semiconductor substrate that includes a plurality of the Rx channels and a plurality of the Tx channels.

8. A packaged device, comprising:
a package substrate configured for attaching to a top surface of a printed circuit board (PCB) having a three-dimensional (3D) antenna structure mounted on the top surface of the PCB including a first antenna connected to a first waveguide feed and a second antenna connected to a second waveguide feed;
the package substrate including:
a top metal surface including a transmit (Tx) radiating structure under the second waveguide feed and a receive (Rx) radiating structure under the first waveguide feed, with a radio frequency (RF) connection from the top metal surface to a bottom surface, with an integrated circuit (IC) die flipchip attached to the bottom surface that includes at least one Rx channel including Rx circuitry and at least one Tx channel comprising Tx circuitry, with the Rx and Tx channels connected by respective ones of the RF connection to the Tx radiating structures and to the Rx radiating structures;

a dielectric layer on the top metal surface, and at least one row of protruding metal features on the dielectric layer positioned under the first and second waveguide feeds on at least 2 sides of the Tx radiating structure and the Rx radiating structure configured to create a waveguiding wall structure for directing signals from the Tx radiating structure through the second waveguide feed to the second antenna from the first antenna through the first waveguide feed to the Rx radiating structure.

9. The packaged device of claim 8, wherein the protruding metal features comprise a plurality of separate metal features that comprise solder balls, metal studs, or wirebond loops.

10. The packaged device of claim 9, wherein the protruding metal features comprise a leadframe (LF) bonded to the dielectric layer having full thickness regions, half-etched regions, and LF aperture regions, including vertical walls in the full thickness regions framing the LF aperture regions that are within a volume defined by the first and the second waveguide feeds.

11. A method of assembling a high frequency wireless device, comprising:
providing a packaged device comprising a package substrate having a top metal surface including a transmit (Tx) radiating structure and a receive (Rx) radiating structure, and a bottom surface with a radio frequency (RF) connection extending from the top metal surface to the bottom surface, with an integrated circuit (IC) die flipchip attached to the bottom surface that includes at least one Rx channel including Rx circuitry and at least one Tx channel comprising Tx circuitry, with the Rx and Tx channels connected by respective ones of the RF connections to the Tx radiating structure and to the Rx radiating structure, and a dielectric layer on the top metal surface;
forming at least one row of protruding metal features on the dielectric layer on at least 2 sides of the Tx radiating structure and the Rx radiating structure;
connecting the packaged device to a top surface of a printed circuit board (PCB);
placing a three-dimensional (3D) antenna structure on the top surface of the PCB including a first antenna connected to a first waveguide feed and a second antenna connected to a second waveguide feed, wherein the first waveguide feed is positioned over the Rx radiating structure and the second waveguide feed is positioned over the Tx radiating structure;
wherein the Tx radiating structure and the Rx radiating structure are configured to create a waveguiding wall for directing signals from the Tx radiating structure through the second waveguide feed to the second antenna and from the first antenna through the first waveguide feed to the Rx radiating structure.

12. The method of claim 11, wherein the at least 2 sides includes all 4 sides around both the Tx radiating structure and the Rx radiating structure.

13. The method of claim 11, wherein the forming the at least one row of protruding metal features comprises forming a plurality of separate metal features.

14. The method of claim 13, wherein the plurality of separate metal features comprise solder balls, metal studs, or wirebond loops.

15. The method of claim 11, wherein the forming the at least one row of protruding metal features comprises forming metal features that overlap.

16. The method of claim 11, wherein the forming the at least one row of protruding metal features comprises bonding a leadframe (LF) to the dielectric layer having full thickness regions that provide the protruding metal features as vertical walls, wherein the LF also includes half-etched regions, and LF aperture regions, where the vertical walls frame the LF aperture regions that are within a volume defined by the first and the second waveguide feeds.

17. The method of claim 11, wherein the high frequency wireless device comprises a radar device.

18. The method of claim 11, wherein the radar device consists of a single chip comprising a semiconductor substrate that includes a plurality of the Rx channels and a plurality of the Tx channels.

19. The method of claim 11, wherein the package substrate comprises an organic substrate, a flexible plastic substrate, or a paper-based substrate.

20. A device, comprising:
a top metal surface including a transmit (Tx) radiating structure and a receive (Rx) radiating structure, with a radio frequency (RF) connection from the top metal surface to a bottom surface, with an integrated circuit (IC) die flipchip attached to the bottom surface that includes at least one Rx channel including Rx circuitry and at least one Tx channel comprising Tx circuitry, with the Rx and Tx channels connected by respective ones of the RF connection to the Tx radiating structures and to the Rx radiating structures;
a dielectric layer on the top metal surface; and
at least one row of protruding metal features on a dielectric layer positioned under first and second waveguide feeds on at least 2 sides of a Tx radiating structure and an Rx radiating structure.

21. The device of claim 20, wherein the protruding metal features are spaced apart.

22. The device of claim 20, wherein the protruding metal features are solder balls.

23. The device of claim 20, wherein the protruding metal features are stud bumps.

24. The device of claim 20, wherein the protruding metal features are wire loops.

25. The device of claim 20, wherein the at least one row of the protruding metal features on a dielectric layer positioned under first and second waveguide feeds on at least 2 sides of a Tx radiating structure and an Rx radiating structure is configured to create a waveguiding wall structure for directing signals from the Tx radiating structure through the second waveguide feed to a second antenna from a first antenna through the first waveguide feed to the Rx radiating structure.

26. An apparatus, comprising:
a first antenna connected to a first waveguide feed and a second antenna connected to a second waveguide feed;
a packaged device comprising a package substrate having a top metal surface including a transmit (Tx) radiating structure under the second waveguide feed and a receive (Rx) radiating structure under the first waveguide feed, with a radio frequency (RF) connection from the top metal surface to a bottom surface, with an integrated circuit (IC) die flipchip attached to the bottom surface that includes at least one Rx channel including Rx circuitry and at least one Tx channel comprising Tx circuitry, and with the Rx and Tx channels connected by respective ones of the RF connection to the Tx radiating structures and to the Rx radiating structures;

a dielectric layer on the top metal surface; and at least one row of protruding metal features on the dielectric layer positioned under the first and second waveguide feeds on at least 2 sides of the Tx radiating structure and the Rx radiating structure.

27. A method of assembling a high frequency wireless device, comprising:

providing a packaged device comprising a package substrate having a top metal surface including a transmit (Tx) radiating structure and a receive (Rx) radiating structure, and a bottom surface with a radio frequency (RF) connection extending from the top metal surface to the bottom surface, with an integrated circuit (IC) die flipchip attached to the bottom surface that includes at least one Rx channel including Rx circuitry and at least one Tx channel comprising Tx circuitry, with the Rx and Tx channels connected by respective ones of the RF connections to the Tx radiating structure and to the Rx radiating structure, and a dielectric layer on the top metal surface; and forming at least one row of protruding metal features on the dielectric layer on at least 2 sides of the Tx radiating structure and the Rx radiating structure.

28. The method of claim 27, further including a first antenna connected to a first waveguide feed and a second antenna connected to a second waveguide feed, wherein the first waveguide feed is positioned over the Rx radiating structure and the second waveguide feed is positioned over the Tx radiating structure.

29. The method of claim 27, wherein the Tx radiating structure and the Rx radiating structure are configured to create a waveguiding wall for directing signals from the Tx radiating structure through the second waveguide feed to the second antenna and from the first antenna through the first waveguide feed to the Rx radiating structure.

\* \* \* \* \*